United States Patent
Shumarayev et al.

(10) Patent No.: US 8,653,853 B1
(45) Date of Patent: Feb. 18, 2014

(54) DIFFERENTIAL INTERFACES FOR POWER DOMAIN CROSSINGS

(75) Inventors: Sergey Shumarayev, Los Altos Hills, CA (US); Tim Tri Hoang, San Jose, CA (US); Lawrence David Smith, San Jose, CA (US)

(73) Assignee: Altera Corporation, San Jose, CA (US)

(*) Notice: Subject to any disclaimer, the term of this patent is extended or adjusted under 35 U.S.C. 154(b) by 1093 days.

(21) Appl. No.: 11/618,828

(22) Filed: Dec. 31, 2006

(51) Int. Cl.
*H03K 19/0175* (2006.01)

(52) U.S. Cl.
USPC ........... 326/82; 326/30; 326/86; 326/87; 327/109

(58) Field of Classification Search
USPC ......... 326/26, 30, 81–83, 86–87, 112, 115; 327/108–109, 333
See application file for complete search history.

(56) References Cited

U.S. PATENT DOCUMENTS

| | | | | |
|---|---|---|---|---|
| 5,519,728 A | * | 5/1996 | Kuo | 375/257 |
| 5,541,532 A | * | 7/1996 | McCall | 326/68 |
| 5,717,345 A | * | 2/1998 | Yokomizo et al. | 326/80 |
| 5,959,492 A | * | 9/1999 | Khoury et al. | 327/389 |
| 5,977,796 A | * | 11/1999 | Gabara | 326/86 |
| 5,994,921 A | * | 11/1999 | Hedberg | 326/81 |
| 6,426,656 B1 | * | 7/2002 | Dally et al. | 327/51 |
| 6,531,896 B1 | * | 3/2003 | Song | 326/86 |
| 7,043,674 B2 | * | 5/2006 | Rearick et al. | 714/724 |
| 7,538,588 B2 | * | 5/2009 | Liu et al. | 327/108 |
| 2006/0132179 A1 | * | 6/2006 | Kim | 326/82 |
| 2008/0061837 A1 | * | 3/2008 | Xu et al. | 326/127 |

* cited by examiner

*Primary Examiner* — Shawki Ismail
*Assistant Examiner* — Christopher Lo
(74) *Attorney, Agent, or Firm* — Steven J. Cahill

(57) ABSTRACT

Techniques are provided for transmitting signals through a differential interface between circuits in different power supply domains. A driver circuit in a first power supply domain converts single-ended signals into differential signals. The driver circuit then transmits the differential signals to a receiver circuit in a second power supply domain. The receiver circuit converts the differential signals back into single-ended signals for transmission to circuit elements in the second power supply domain. The differential interface reduces the transmission of noise between circuit elements in the first power supply domain and circuit elements in the second power supply domain.

19 Claims, 8 Drawing Sheets

DIFFERENTIAL INTERFACES FOR POWER DOMAIN CROSSINGS

BACKGROUND OF THE INVENTION

The present invention relates to electronic circuits, and more particularly, to interfaces on integrated circuit die.

Field programmable gate arrays (FPGAs) are integrated circuits that contain programmable logic circuits. Often, FPGAs also contain one or more analog circuits, such as a phase-locked loop (PLL) or a delay-locked loop (DLL). The performance of PLLs and other analog circuits are particularly sensitive to noise, especially simultaneous switching noise (SSN). It is generally believed that SSN is caused by the delta current noise in the power distribution network and mutual inductive coupling among many switching input/output buffers.

Circuit elements on an integrated circuit die can be referenced to a common ground voltage to prevent glitches on signals that are transmitted between them. The glitches can degrade signal integrity and circuit performance.

However, a common ground may require shorting the substrate in deep N-wells that should be isolated from noise through a common substrate. Key PLL performance parameters, such as the phase noise, may be compromised when the substrate in deep N-well is shorted to a common ground on the die.

Sensitive analog circuits, such as PLLs and DLLs, should have their power supplies, substrates, and N-wells completely separated from noisy circuits in order to maintain maximum performance. However, separate power supply voltages can fluctuate relative to each other, which can cause signals transmitted between circuits in separate power supply domains to change state.

Therefore, it would be desirable to provide techniques for transmitting signals between analog and digital circuits on an integrated circuit die while providing adequate noise isolation.

BRIEF SUMMARY OF THE INVENTION

The present invention provides circuits and methods for transmitting signals through a differential interface between circuits in different power supply domains. A driver circuit in a first power supply domain converts single-ended signals into differential signals. The driver circuit then transmits the differential signals to a receiver circuit in a second power supply domain. The receiver circuit converts the differential signals back into single-ended signals for transmission to circuit elements in the second power supply domain. The techniques of the present invention reduce the transmission of noise between circuit elements in the first power supply domain and circuit elements in the second power supply domain.

Other objects, features, and advantages of the present invention will become apparent upon consideration of the following detailed description and the accompanying drawings.

DETAILED DESCRIPTION OF THE INVENTION

Figure 1:
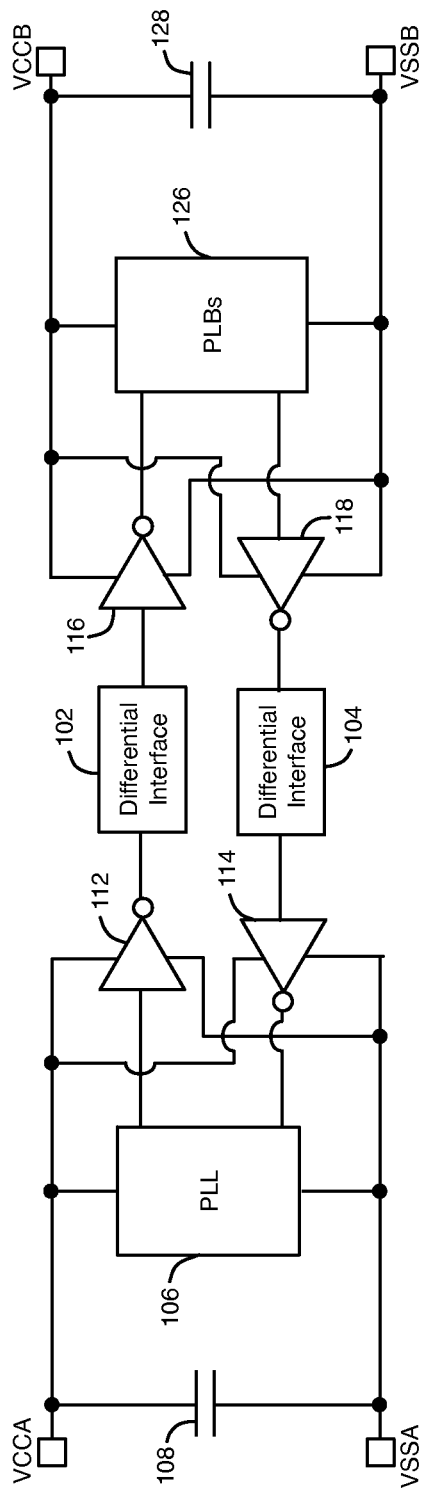
FIG. 1 illustrates differential interfaces that couple together circuit elements in two different power supply domains on an integrated circuit die, according to an embodiment of the present invention.

FIG. 1 illustrates differential interfaces that couple together circuit elements in two different power supply domains on an integrated circuit die, according to an embodiment of the present invention. Power supply domain A on the integrated circuit die receives a power supply voltage VCCA and a ground voltage VSSA. Power supply domain B on the integrated circuit die receives a power supply voltage VCCB and a ground voltage VSSB. Each power supply domain includes a network of interconnect conductors that transmit the power supply and ground voltages to numerous circuit elements on the die.

In power supply domain A, the capacitance between the power supply voltage network VCCA and the ground voltage network VSSA is represented in FIG. 1 by capacitor 108. In power supply domain B, the capacitance between the power supply voltage network VCCB and the ground voltage network VSSB is represented in FIG. 1 by capacitor 128.

Ideally, the power supply and ground voltages are constant. However, the switching of transistors on a die usually causes the power supply voltages and the ground voltages to fluctuate. These voltage fluctuations are considered to be power supply noise. The capacitance of capacitor 108 is typically large enough to cause the voltage difference between VCCA and VSSA to remain the same most of the time, despite power supply voltage fluctuations. Also, the capacitance of capacitor 128 is typically large enough to cause the voltage difference between VCCB and VSSB to remain the same most of the time, despite power supply voltage fluctuations.

The voltage difference between the power supply voltage VCCA and the ground voltage VSSA in the first power supply domain drives a first set of circuit elements that includes phase-locked loop (PLL) circuit 106 and inverting buffer circuits 112 and 114. The voltage difference between the power supply voltage VCCB and the ground voltage VSSB in the second power supply domain drives a second set of circuit elements that includes programmable logic blocks (PLBs) 126 and inverting buffer circuits 116 and 118. All of the circuit elements shown in FIG. 1 are located on the same integrated circuit die.

Power supply domains VCCA/VSSA and VCCB/VSSB are electrically isolated from each other on the integrated circuit die so that noise on the power supply and ground voltages does not propagate between PLBs 126 and the PLL 106. PLBs 126 are especially noisy. Therefore, noise isolation between PLL 106 and PLBs 126 is important for preventing noise generated by the PLBs from propagating to PLL 106 through the power supply and ground routing networks. The operating parameters of a PLL, including the jitter and phase noise in the PLL output signals, are particularly sensitive to noise from the power supply and ground voltages.

Because power supply domains A and B are isolated from each other, fluctuations in the voltage of VCCA usually do not match fluctuations in the voltage of VCCB, and fluctuations in the voltage of VSSA usually do not match fluctuations in the voltage of VSSB. As a result of the difference between the voltage fluctuations in power supply domains A and B, signals that are driven between the two power supply domains are more likely to be distorted. For example, as a signal is transmitted from one power supply domain to another, power supply noise can cause a digital high signal to be misinterpreted as a digital low signal when the signal level temporarily drops below the high threshold of the destination driver. Also, as a signal is transmitted from one power supply domain to another, power supply noise can cause a digital low signal to be misinterpreted as a digital high signal when the signal level rises temporarily above the low threshold of the destination driver.

Differential interfaces 102 and 104 of the present invention are designed reduce distortion from noise in signals that are driven between the two different power supply domains. Differential interface 102 drives signals from buffer 112 to buffer 116, and differential interface 104 drives signals from buffer 118 to buffer 114. PLL 106 receives signals from buffer 114 and drives signals to buffer 112. PLBs 126 receive signals from buffer 116 and drive signals to buffer 118.

Figure 2:
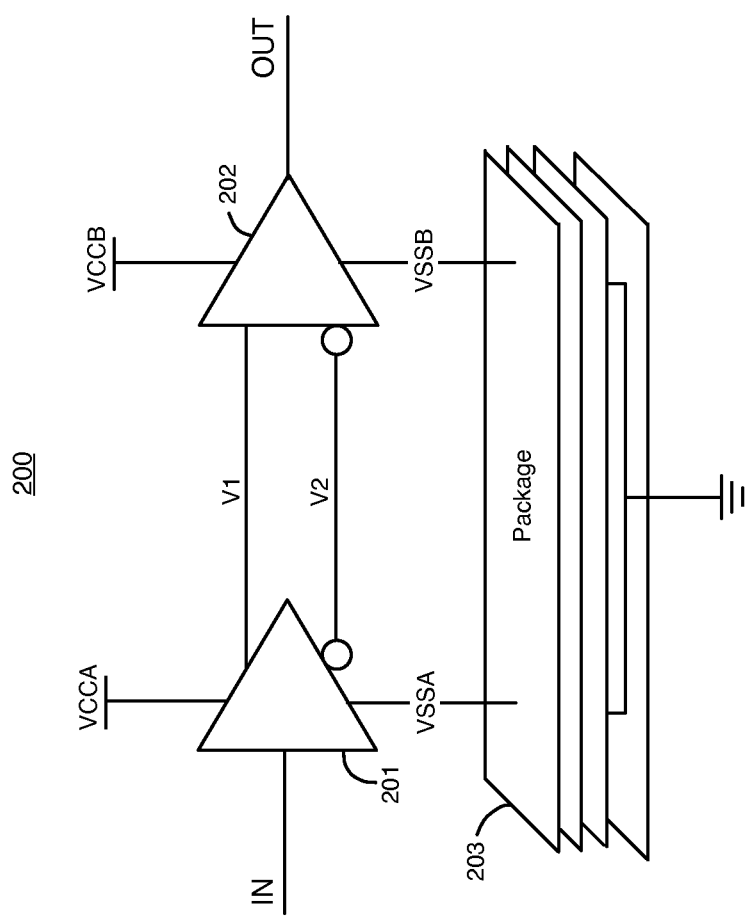
FIG. 2 illustrates a top level diagram of a differential interface that can drive signals through a power domain crossing, according to an embodiment of the present invention.

FIG. 2 illustrates a top level diagram of a differential interface 200, according to an embodiment of the present invention. Differential interface 200 is configured to drive signals between circuits in two different power supply domains on an integrated circuit die. Differential interface 200 reduces the amount of noise (e.g., jitter) that is introduced into the signals when they are driven across a power domain crossing. Differential interface 200 is an example of differential interfaces 102 and 104 in FIG. 1.

Differential interface 200 includes single-ended-to-differential driver 201 and differential-to-single-ended receiver 202. Driver 201 receives the power supply voltage VCCA and the ground voltage VSSA from the first power supply domain. Receiver 202 receives the power supply voltage VCCB and the ground voltage VSSB from the second power supply domain. Both of the ground voltages VSSA and VSSB are coupled to a package 203. The ground voltages VSSA and VSSB can be shorted together at the last package layer as shown in FIG. 2. A board decoupling capacitor can filter out or attenuate power supply noise. However, the ground voltages VSSA and VSSB are preferably electrically isolated at the package level.

Driver 201 converts single-ended input signals at terminal IN into differential output signals V1 and V2. The differential output signals V1 and V2 of driver 201 are transmitted to the differential inputs of receiver 202. In FIG. 2, the inverting output of driver 201 is coupled to the inverting input of receiver 202, and the non-inverting output of driver 201 is coupled to the non-inverting input of receiver 202. According to an alternative embodiment, the non-inverting output of driver 201 can be coupled to the inverting input of receiver 202, and the inverting output of driver 201 can be coupled to the non-inverting input of receiver 202. Receiver 202 converts the differential output signals of driver 201 back into single-ended output signals at OUT.

The input signals received at input terminal IN are transmitted as differential signals from the first power supply domain VCCA/VSSA to the second power supply domain VCCB/VSSB from driver 201 to receiver 202. In general, a receiver buffer can filter out noise more easily from differential signals than from single-ended signals. Most causes of noise generate the same or a similar amount of distortion in both of the differential signals. Therefore, one of the differential signals can be used as a reference to cancel out noise from the other differential signal. As a result, receiver buffer 202 is better able to reject noise, such as jitter and glitches, that is introduced into the signals at the power domain crossing, than a buffer receiving a single-ended input signal.

A programmable interface to an analog circuit block in an FPGA typically drives three types of signals. The three types of signals are control signals, programmable bits, and fast data signals. Any of these three types of signals can be effected by noise when being transmitted through a power domain crossing from one power supply domain to another.

When the noise level is moderate, differential interfaces of the present invention are particularly beneficial for transmitting fast data signals and critical control signals across a power domain crossing to reduce induced jitter caused by changing voltage levels. When the noise level is relatively large, differential interfaces of the present invention can benefit all three types of signals including the control signals, programmable bits, and fast data signals. The techniques of the present invention can improve the performance of circuit elements that receive signals transmitted from another power supply domain.

Several implementations can embody the single-ended-to-differential driver 201 and the differential-to-single-ended receiver 202 shown in FIG. 2. The overall system cost and power is an important consideration in the selection of a particular implementation.

On an FPGA die having a complex analog circuit block, many signals may cross an interface between two power supply domains on the same die. Typically, some of the signals that cross between power supply domains are speed critical and others are not speed critical. The accuracy of the signals that are speed critical can be improved by using a high speed differential interface of the present invention to bridge a power domain crossing. Signals that are not speed critical can be safely driven across a power domain crossing with a slower differential interface of the present invention to reduce the overall system cost and power consumption. An example of a slower differential interface of the present invention that consumes less power is shown in FIG. 3.

Figure 3:
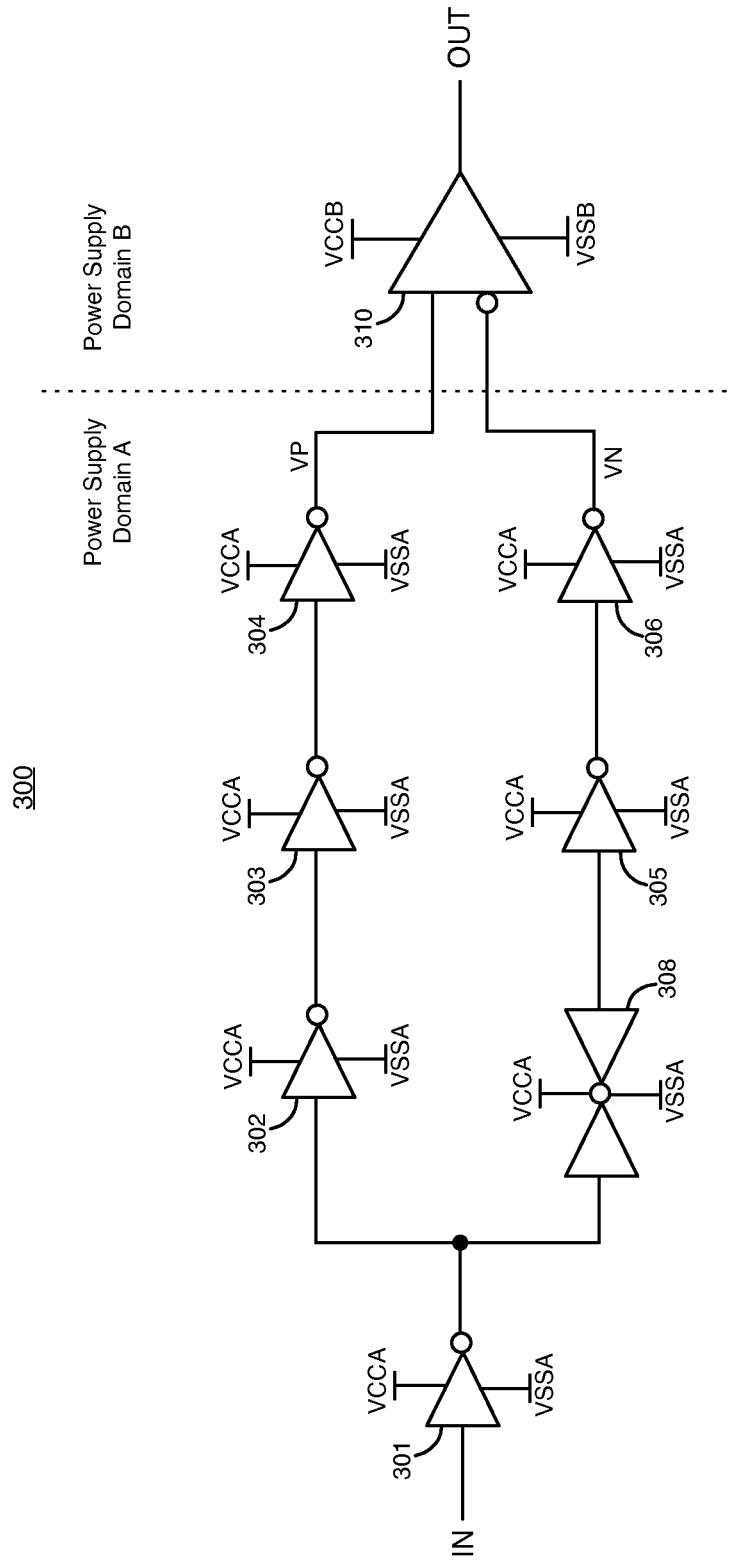
FIG. 3 illustrates an implementation of a differential interface that can drive signals between circuits in two different power supply domains, according to an embodiment of the present invention.

FIG. 3 illustrates an implementation of a differential interface 300 that can drive signals between circuits in two different power supply domains, according to an embodiment of the present invention. Differential interface 300 is a specific example of differential interface 200 shown in FIG. 2. Differential interface 300 includes inverters 301-306, non-inverting pass gate 308, and operational amplifier 310.

Inverters 301-306 and pass gate 308 receive power supply voltage VCCA and ground voltage VSSA in power supply domain A. Operation amplifier 310 receives power supply voltage VCCB and ground voltage VSSB in power supply domain B. Inverters 301-306 and pass gate 308 are an implementation of single-ended-to-differential driver 201, and amplifier 310 is an implementation of differential-to-single-ended receiver 202 of FIG. 2.

Inverters 301-306 and pass gate 308 form a splitter circuit that splits single-ended signals at input terminal IN into differential signals having differential voltages VP and VN. Inverter 301 drives input signals at input terminal IN to the input of inverter 302 and the input of pass gate 308. The three inverters 302-304 are coupled in series as shown in FIG. 3 to form a first branch of the splitter circuit. The output voltage VP of inverter 304 is not inverted with respect to the input voltage at IN. Pass gate 308 and inverters 305-306 are coupled in series as shown in FIG. 3 to form a second branch of the splitter circuit. The output voltage VN of inverter 306 is inverted with respect to the input voltage at IN. Pass gate 308 is added to interface 300 so that the delay through circuits 308 and 305-306 is the same (or nearly the same) as the delay through inverters 302-304.

Voltages VP and VN form a differential voltage signal that is referenced with respect to power supply domain A. Voltage VP is transmitted to the non-inverting input of operational amplifier 310, and voltage VN is transmitted to the inverting input of operational amplifier 310. Operational amplifier 310 converts differential signal VP/VN back into a single-ended signal at OUT that is referenced with respect to power supply domain B. Operational amplifier 310 can more easily reject noise from voltages VP and VN, because voltages VP and VN form a differential signal.

Figure 4:
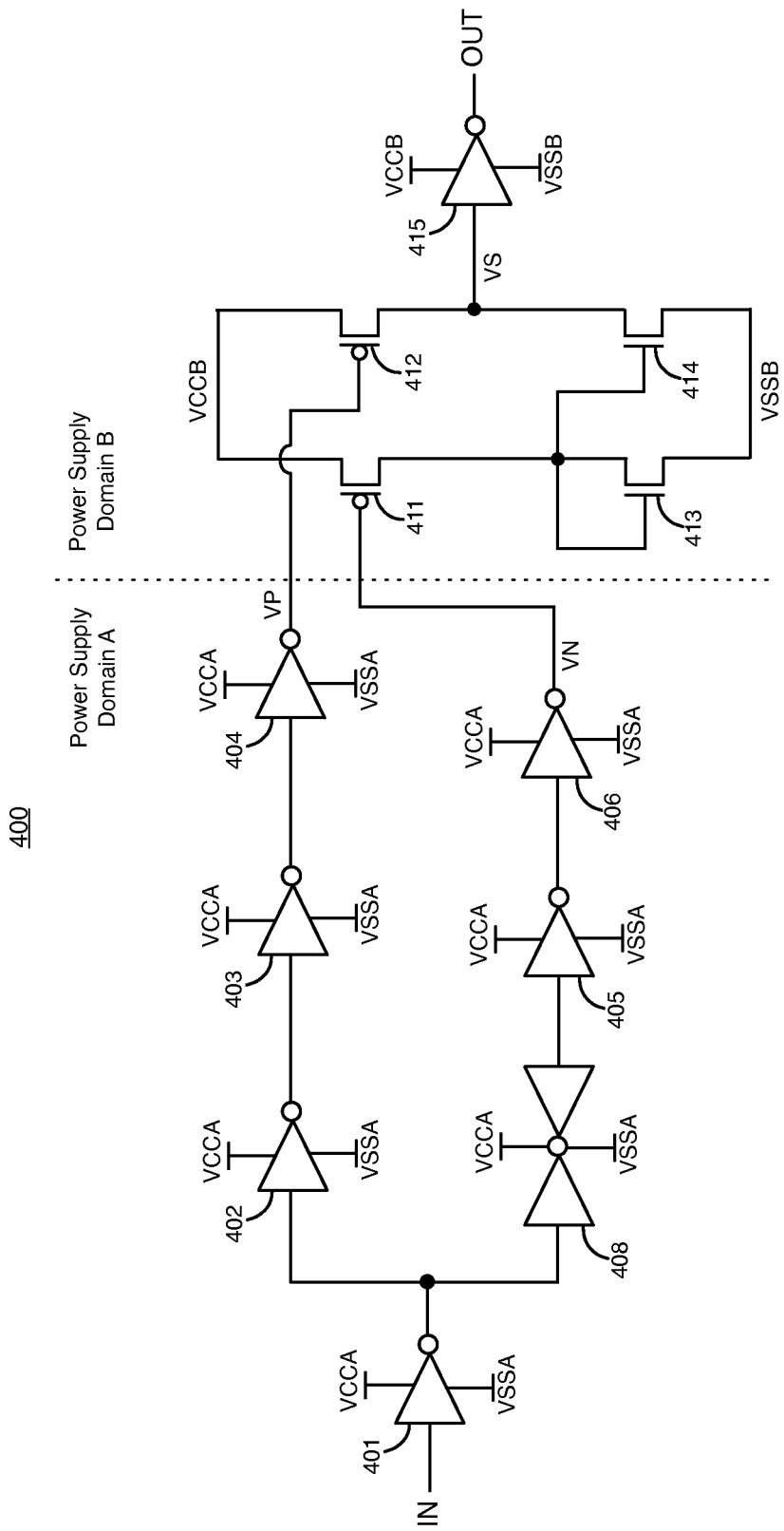
FIG. 4 illustrates another implementation of a differential interface that can drive signals between circuits in two different power supply domains, according to an embodiment of the present invention.

FIG. 4 illustrates another implementation of a differential interface 400 that can drive signals between circuits in two different power supply domains, according to another embodiment of the present invention. Differential interface 400 is a specific example of differential interface 200 shown in FIG. 2. Differential interface 400 includes inverters 401-406, non-inverting pass gate 408, p-channel MOS field-effect transistors 411-412, n-channel MOS field-effect transistors 413 and 414, and inverter 415.

Inverters 401-406 and pass gate 408 receive power supply voltage VCCA and ground voltage VSSA in power supply domain A. Transistors 411-414 and inverter 415 receive power supply voltage VCCB and ground voltage VSSB in power supply domain B. Inverters 401-406 and pass gate 408 are an implementation of single-ended-to-differential driver 201. Transistors 411-414 and inverter 415 are an implementation of differential-to-single-ended receiver 202 of FIG. 2.

Inverters 401-406 and pass gate 408 form a splitter circuit that splits single-ended signals at input terminal IN into differential signals having differential voltages VP and VN. Inverters 402-404 are coupled in series to form a first branch of the splitter, and pass gate 408 and inverters 405-406 are coupled in series to form a second branch of the splitter.

The output voltage VP of inverter 404 is not inverted with respect to the input voltage at IN. The output voltage VN of inverter 406 is inverted with respect to the input voltage at IN. As with interface 300, pass gate 408 is added to interface 400 so that the delay through circuits 408 and 405-406 is the same (or nearly the same) as the delay through inverters 402-404.

Transistors 411-414 form an amplifier that converts differential voltages VP and VN into a single-ended voltage VS at the input of inverter 415. P-channel transistor 411 receives voltage VN at its gate, and p-channel transistor 412 receives voltage VP at its gate. The sources of p-channel transistors 411-412 are coupled to receive supply voltage VCCB. The drains of p-channel transistors 411-412 are coupled to the drains of transistors 413-414, respectively. Transistors 413-414 provide a current source for transistors 411-412. The sources of transistors 413-414 are coupled to receive ground voltage VSSB.

The drain voltage VS of p-channel transistor 412 is the single-ended output voltage of the amplifier formed by transistors 411-414. Inverter 415 drives VS to generate a single-ended output signal at output terminal OUT that is referenced with respect to power supply domain B. The amplifier formed by transistors 411-414 can more easily reject noise from voltages VP and VN, because voltages VP and VN form a differential signal.

Differential interfaces 300 and 400 can be used to drive lower speed signals between power supply domains. For example, differential interfaces 300 and 400 can be used to drive control signals and programmable bits between an analog circuit block, such as a PLL, and programmable logic blocks (PLBs) on a programmable logic integrated circuit. Further embodiments of the present invention can drive high speed data signals and high speed clock signals between different power supply domains. An example of a differential interface of the present invention that is particularly useful for driving high speed signals between circuits in different power supply domains is shown in FIG. 5.

Figure 5:
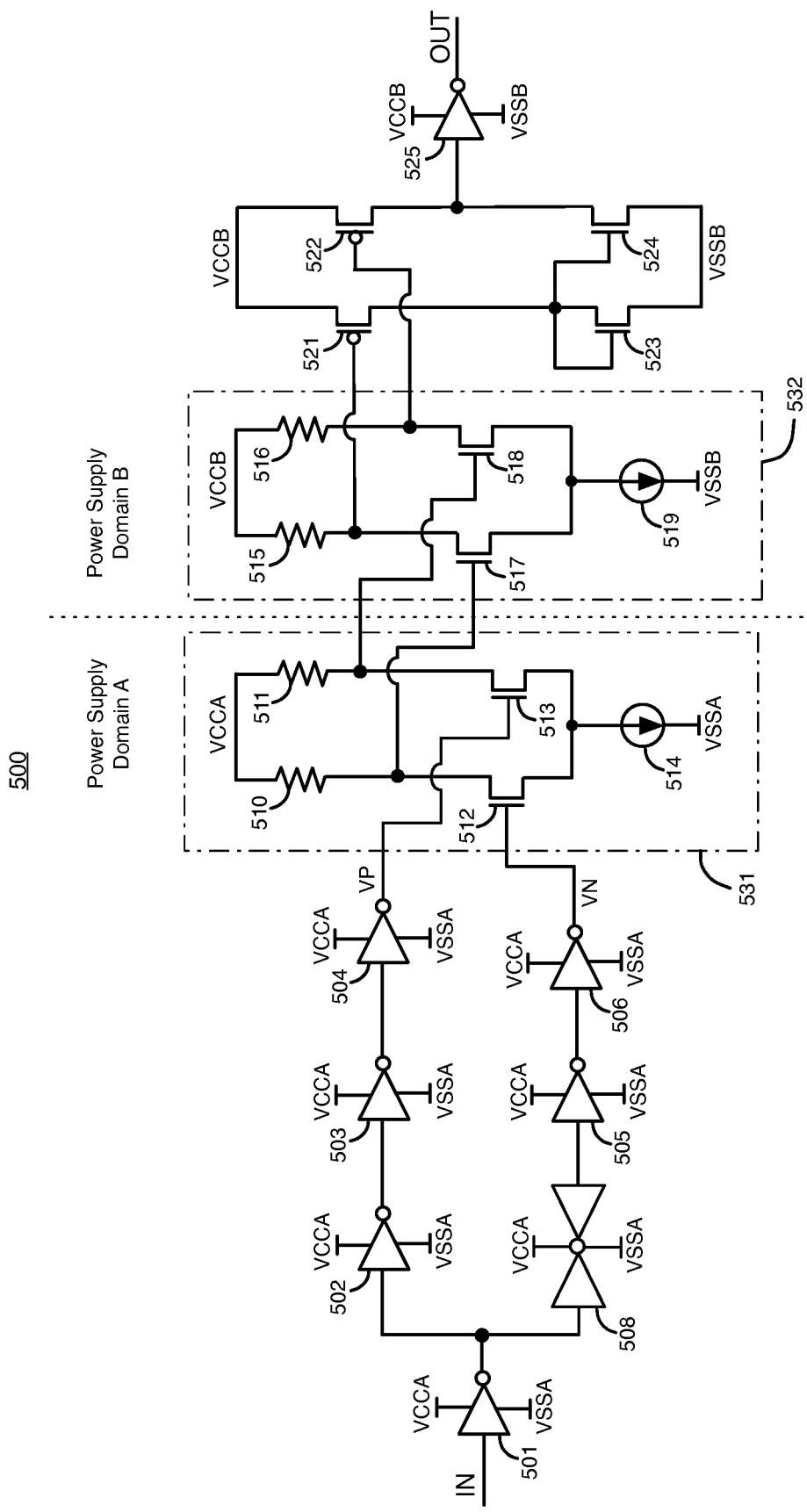
FIG. 5 illustrates an implementation of a differential interface that can drive high speed signals between circuits in two different power supply domains, according to another embodiment of the present invention.

FIG. 5 illustrates an implementation of a differential interface 500 that can drive high speed signals between circuits in two different power supply domains, according to another embodiment of the present invention. Differential interface 500 is a specific example of differential interface 200 shown in FIG. 2. Differential interface 500 includes inverters 501-506, pass gate 508, current mode logic (CML) circuits 531-532, p-channel MOS field-effect transistors 521-522, n-channel MOS field-effect transistors 523-524, and inverter 525. CML circuit 531 includes passive load resistors 510-511, re-channel MOS field-effect transistors 512-513, and current source 514. CML circuit 532 includes passive load resistors 515-516, n-channel MOS field-effect transistors 517-518, and current source 519.

Inverters 501-506, pass gate 508, and CML circuit 531 receive power supply voltage VCCA and ground voltage VSSA in power supply domain A. CML circuit 532, the amplifier formed by transistors 521-524, and inverter 525 receive power supply voltage VCCB and ground voltage VSSB in power supply domain B. Inverters 501-506, pass gate 508, and CML circuit 531 are an implementation of single-ended-to-differential driver 201. CML circuit 532, transistors 521-524, and inverter 525 are an implementation of differential-to-single-ended receiver 202 of FIG. 2.

Inverters 501-506 and pass gate 508 form a splitter circuit that splits single-ended signals at input terminal IN into differential signals having differential voltages VP and VN. Inverters 502-504 are coupled in series to form a first branch of the splitter. Pass gate 508 and inverters 505-506 are coupled in series to form a second branch of the splitter.

The inputs of CML 531 at the gates of transistors 512 and 513 are coupled to receive the differential output voltages VN and VP, respectively, of the splitter circuit at the outputs of inverters 506 and 504. Load resistors 510-511 provide load current for transistors 512 and 513, respectively. The outputs of CML 531 at the drains of transistors 512 and 513 are coupled to the inputs of CML 532 at the gates of transistors 517 and 518, respectively. Load resistors 515 and 516 provide load current for transistors 517 and 518, respectively. Passive load resistors 510-511 and 515-516 allow CML circuits 531 and 532 to operate at high speed.

Transistors 521-524 form an amplifier. The outputs of CML 532 at the drains of transistors 517 and 518 are coupled to the inputs of the amplifier at the gates of p-channel transistors 521 and 522, respectively. Transistors 523-524 form a current source. The output of the amplifier at the drain of transistor 522 is coupled to the input of inverter 525. The output of inverter 525 generates the single-ended output signals of interface 500 at output terminal OUT.

High speed differential interface 500 reduces jitter on signals that are transmitted from circuits in power supply domain A to circuits in power supply domain B. CML circuits 531-532 allow differential interface 500 to transmit signals from circuits in power supply domain A to circuits in power supply domain B at a high speed without degrading the integrity of the signals. Differential interface 500 is ideal for transmitting data signals and clock signals between different power supply domains. However, differential interface 500 consumes more power than differential interfaces 300 and 400, because CML 531 and CML 532 are constant current sources that continuously draw current from the power supply voltages.

Figure 6:
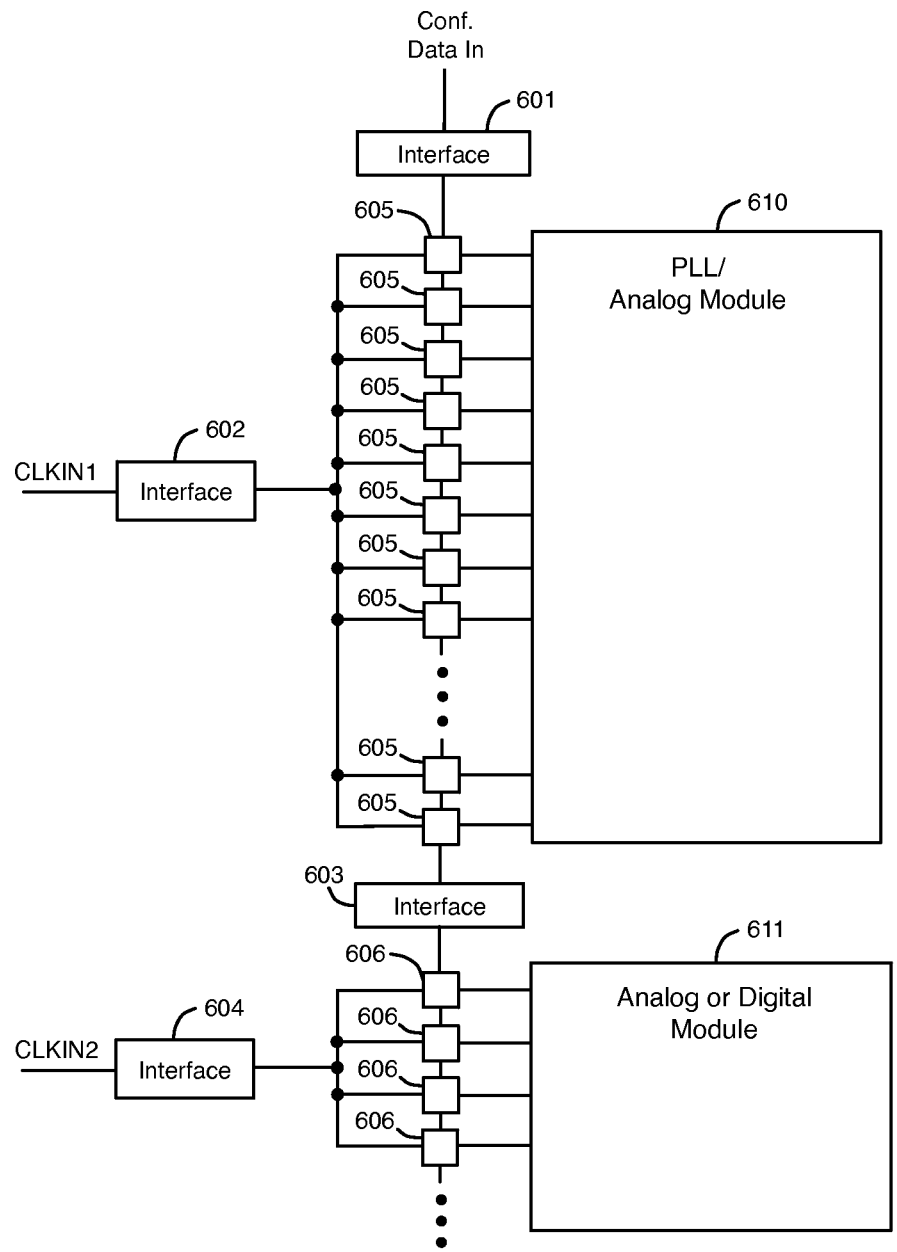
FIG. 6 illustrates a portion of a programmable integrated circuit containing differential interfaces that are used to drive signals to groups of configuration scan registers, according to another embodiment of the present invention.

FIG. 6 illustrates a portion of a programmable integrated circuit containing differential interfaces that are used to drive signals to groups of configuration scan registers, according to another embodiment of the present invention. A programmable integrated circuit can include, for example, field programmable gate arrays (FPGAs), programmable logic devices (PLDs), programmable logic arrays, etc.

The programmable integrated circuit of FIG. 6 includes two circuit modules 610 and 611. Module 610 can be a PLL or another type of analog circuit module. Module 611 is an analog circuit module (e.g., a second PLL) or a digital circuit module (e.g., a group of programmable logic blocks). Module 610 receives power supply and ground voltages in a first power supply domain, and module 611 receives power supply and ground voltages in a second power supply domain. The first and second power supply domains are electrically isolated from each other to prevent power supply noise from propagating between modules 610 and 611.

Each of the interfaces 601-604 contains a differential interface of the present invention. For example, each of interfaces 601-604 can include any of differential interfaces 200, 300, 400, or 500.

Interface 601 receives configuration data (from inside or outside the integrated circuit) and drives the configuration data into configuration scan registers (CSRs) 605. CSRs 605 are coupled together in series to form a scan chain. A programmable integrated circuit typically includes hundreds or thousands of CSRs. Only a small number of CSRs are shown in FIG. 6 to simplify the drawing.

The configuration data is serially shifted into configuration scan registers 605 through interface 601. Registers 605 are clocked by a clock signal CLKIN1. CLKIN1 is transmitted from inside or outside the integrated circuit to an input of interface 602. Interface 602 drives CLKIN1 to clock inputs of each of registers 605.

The configuration data and the clock signal CLKIN1 are driven from power supply domains that are isolated from the power supply domain that drives module 610. CSRs 605 are in the same power supply domain as module 610. Interfaces 601 and 602 reduce the noise that is introduced into the configuration data signals and the clock signal CLKIN1 as they are transmitted through the power domain crossings to configuration scan registers 605.

After the configuration data is serially shifted into registers 605, the configuration data is loaded in parallel into module 610. The configuration data is used to configure programmable settings in module 610.

Configuration data can also be serially shifted from CSRs 605 through interface 603 into configuration shift registers 606. Registers 605 and 606 are in different power supply domains. Thus, registers 605 and 606 are driven by different power supply voltages and different ground voltages. Interface 603 reduces the amount of noise (e.g., jitter) that is introduced into the configuration data signals as they are driven across the power domain crossing from registers 605 to registers 606.

Registers 606 are clocked by a second clock signal CLKIN2. CLKIN2 is transmitted from inside or outside the integrated circuit to an input of interface 604. Interface 604 drives CLKIN2 to clock inputs of each of registers 606. After the configuration data is serially shifted into registers 606, the configuration data is loaded in parallel into module 611. The configuration data is used to configure programmable settings in module 611.

Clock signal CLKIN2 is driven from a power supply domain that is isolated from the power supply domain used by module 611. CSRs 606 are in the same power supply domain as module 611. Interface 604 reduces the noise that is introduced into CLKIN2 as it is transmitted through the power domain crossing to configuration scan registers 606.

Differential interfaces of the present invention can be used to drive signals between any power domain crossing. For example, a differential interface of the present invention can drive signals from a PLL to the core programmable logic of an FPGA, from a transceiver to core programmable logic, or from input/output blocks to core programmable logic. If desired, CRAM and CSRs for the high-speed blocks on an FPGA can be placed in a local power supply voltage domain so that there is no control signal power supply domain crossing during normal operation.

Figure 7:
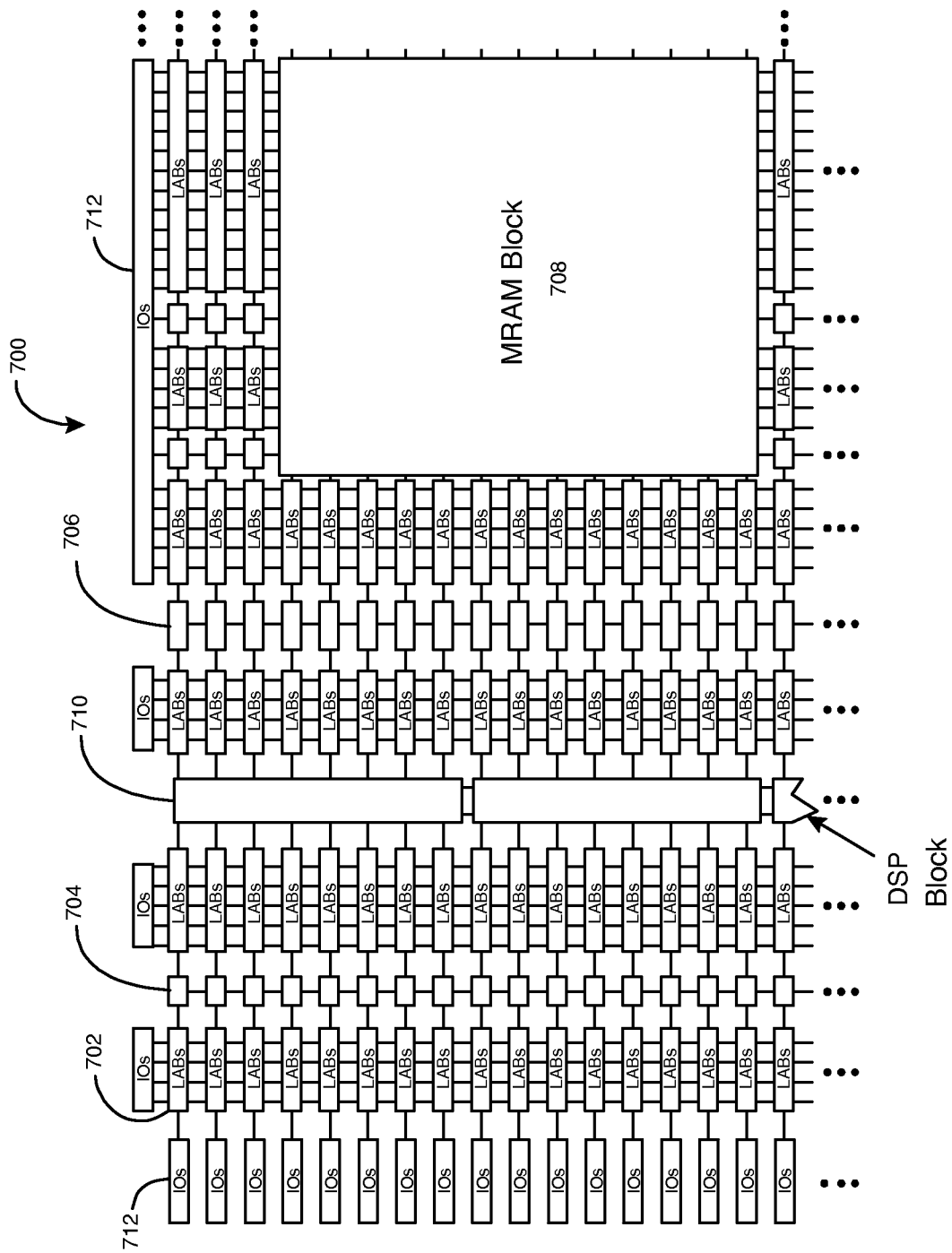
FIG. 7 is a simplified block diagram of a field programmable gate array (FPGA) that can embody the techniques of the present invention.

FIG. 7 is a simplified partial block diagram of an FPGA 700 that can include aspects of the present invention. FPGA 700 is merely one example of an integrated circuit that can include features of the present invention. It should be understood that differential interfaces of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including RAM blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. IO blocks (IOs) 712 located, in this example, around the periphery of the chip support numerous single-ended and differential input/output standards. The IO blocks 712 contain IO buffers and are typically grouped into IO banks. It is to be understood that FPGA 700 is described herein for illustrative purposes only and that the present invention can be implemented in many different types of PLDs, FPGAs, and the like.

Figure 8:
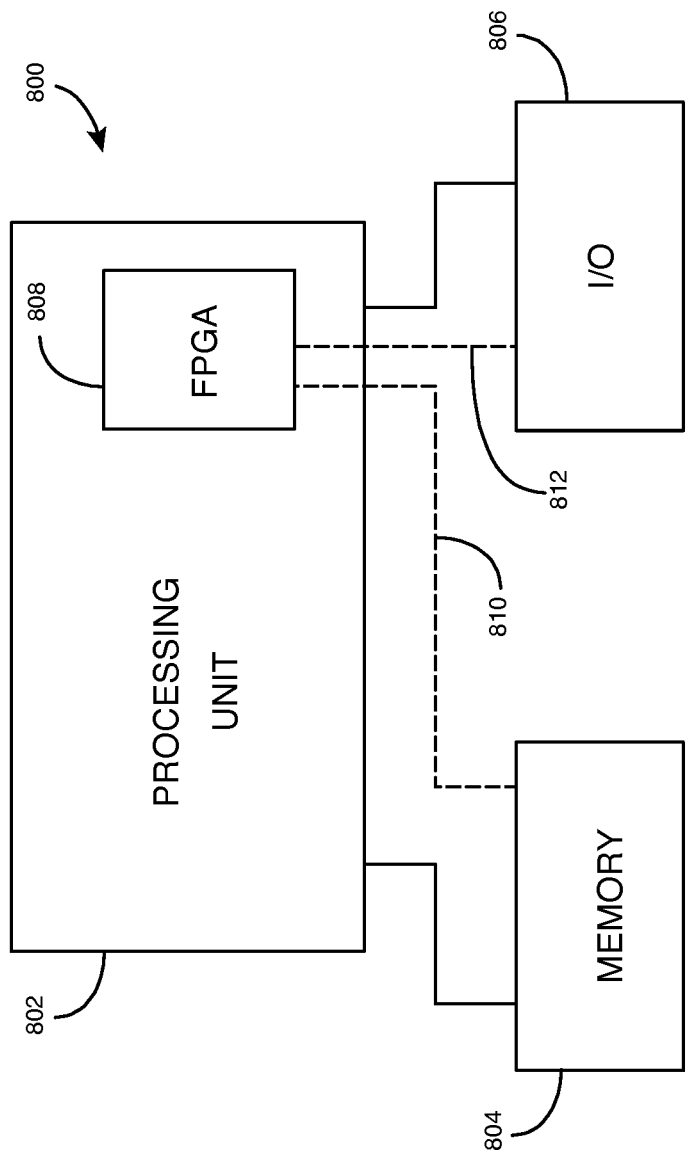
FIG. 8 is a block diagram of an electronic system that can implement embodiments of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, an FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

The invention claimed is:

1. An integrated circuit comprising a differential interface, wherein the differential interface comprises:
a driver circuit comprising an input to receive a single-ended input signal and outputs to output differential output signals, the driver circuit to receive a first power supply voltage and a first ground voltage in a first power supply domain in the integrated circuit, wherein the driver circuit further comprises a first current mode logic circuit, wherein the first current mode logic circuit comprises first and second transistors, wherein a drain of the first transistor is coupled to a first resistor, wherein a drain of the second transistor is coupled to a second resistor, wherein the first resistor is coupled to the second resistor, and wherein a source of the first transistor is coupled to a source of the second transistor and to a current source; and
a receiver circuit comprising inputs to receive the differential output signals of the driver circuit and an output to output a single-ended output signal, the receiver circuit to receive a second power supply voltage and a second ground voltage in a second power supply domain in the integrated circuit, wherein the first and the second power supply domains are electrically isolated from each other in the integrated circuit, and wherein the driver circuit and the receiver circuit are in the integrated circuit,
wherein the receiver circuit further comprises a second current mode logic circuit having differential inputs coupled to differential outputs of the first current mode logic circuit, wherein the second current mode logic circuit comprises third and fourth transistors, wherein a drain of the third transistor is coupled to a third resistor, wherein a drain of the fourth transistor is coupled to a fourth resistor, wherein the third and the fourth resistors are coupled to a node at the second power supply voltage, and wherein a source of the third transistor is coupled to a source of the fourth transistor.

2. The integrated circuit defined in claim 1 wherein the driver circuit further comprises a splitter circuit coupled to the input of the driver circuit and to the first current mode logic circuit.

3. An integrated circuit comprising a differential interface, wherein the differential interface comprises:
a driver circuit comprising an input to receive a single-ended input signal and outputs to output differential output signals, the driver circuit to receive a first power supply voltage and a first ground voltage in a first power supply domain in the integrated circuit; and
a receiver circuit comprising inputs to receive the differential output signals of the driver circuit and an output to output a single-ended output signal, the receiver circuit to receive a second power supply voltage and a second ground voltage in a second power supply domain in the integrated circuit, wherein the first and the second power supply domains are electrically isolated from each other in the integrated circuit, wherein the driver circuit and the receiver circuit are in the integrated circuit,
wherein the receiver circuit comprises a current mode logic circuit comprising first and second transistors, wherein the first and the second transistors receive the differential output signals of the driver circuit, wherein a drain of the first transistor is coupled to a first resistor, wherein a drain of the second transistor is coupled to a second resistor, wherein the first and the second resistors are coupled to a node at the second power supply voltage, wherein the second power supply voltage is above the second ground voltage, and wherein a source of the first transistor is coupled to a source of the second transistor and to a current source.

4. The integrated circuit defined in claim 3 wherein the receiver circuit further comprises an amplifier circuit coupled to the current mode logic circuit.

5. The integrated circuit defined in claim 4 wherein the amplifier circuit comprises a third transistor coupled to the drain of the first transistor and a fourth transistor coupled to the drain of the second transistor.

6. An integrated circuit comprising a differential interface, wherein the differential interface comprises:

a driver circuit comprising an input to receive a single-ended input signal and outputs to output differential output signals, the driver circuit to receive a first power supply voltage and a first ground voltage in a first power supply domain in the integrated circuit; and a receiver circuit comprising inputs to receive the differential output signals of the driver circuit and an output to output a single-ended output signal, the receiver circuit to receive a second power supply voltage and a second ground voltage in a second power supply domain in the integrated circuit, wherein the first and the second power supply domains are electrically isolated from each other in the integrated circuit, wherein the driver circuit and the receiver circuit are in the integrated circuit, wherein the receiver circuit further comprises a current mode logic circuit comprising first and second transistors, wherein the first and the second transistors receive the differential output signals of the driver circuit, wherein a drain of the first transistor is coupled to a first resistor, wherein a drain of the second transistor is coupled to a second resistor, wherein the first and the second resistors are coupled together, wherein a source of the first transistor is coupled to a source of the second transistor and to a current source, and wherein the receiver circuit further comprises an amplifier comprising a third transistor coupled to the drain of the first transistor, and a fourth transistor coupled to the drain of the second transistor.

7. The integrated circuit defined in claim 1 wherein the receiver circuit further comprises an amplifier coupled to differential outputs of the second current mode logic circuit.

8. The integrated circuit defined in claim 7 wherein the receiver circuit further comprises an inverter coupled to a single-ended output of the amplifier.

9. The integrated circuit defined in claim 1 wherein the integrated circuit is a programmable integrated circuit, and the single-ended output signal of the receiver circuit is transmitted to a configuration scan register.

10. A method comprising:
    driving a signal from a single-ended input to differential outputs of a driver circuit, wherein the driver circuit receives a first power supply voltage and a first ground voltage in a first power supply domain, wherein the first power supply domain is in an integrated circuit, wherein driving a signal from the single-ended input to the differential outputs of the driver circuit further comprises driving the signal through a first current mode logic circuit in the driver circuit, wherein the first current mode logic circuit comprises first and second transistors and a first resistor coupled between a drain of the first transistor and a second resistor, wherein the second resistor is coupled to a drain of the second transistor; and
    driving signals from differential inputs to a single-ended output of a receiver circuit, wherein the receiver circuit receives the signals from the differential outputs of the driver circuit, wherein the receiver circuit receives a second power supply voltage and a second ground voltage in a second power supply domain, wherein the second power supply domain is in the integrated circuit, wherein the first and the second power supply domains are electrically isolated from each other in the integrated circuit, and wherein the driver circuit and the receiver circuit are in the integrated circuit,
    wherein driving signals from differential inputs to a single-ended output of a receiver circuit further comprises driving the signals from the differential inputs to the single-ended output of the receiver circuit with a second current mode logic circuit comprising third and fourth transistors that are coupled to the differential outputs of the driver circuit, wherein a drain of the third transistor is coupled to a third resistor, wherein a drain of the fourth transistor is coupled to a fourth resistor, wherein the third and the fourth resistors are coupled to a node at the second power supply voltage, and wherein a source of the third transistor is coupled to a source of the fourth transistor.

11. The method defined in claim 10 wherein driving a signal from the single-ended input to the differential outputs of the driver circuit further comprises driving the signal from the single-ended input through a splitter circuit in the driver circuit.

12. A method comprising:
    driving a signal from a single-ended input to differential outputs of a driver circuit, wherein the driver circuit receives a first power supply voltage and a first ground voltage in a first power supply domain, wherein the first power supply domain is in an integrated circuit; and
    driving signals from differential inputs to a single-ended output of a receiver circuit, wherein the receiver circuit receives the signals from the differential outputs of the driver circuit, wherein the receiver circuit receives a second power supply voltage and a second ground voltage in a second power supply domain, wherein the second power supply domain is in the integrated circuit, wherein the first and the second power supply domains are electrically isolated from each other in the integrated circuit, and wherein the driver circuit and the receiver circuit are in the integrated circuit,
    wherein driving signals from differential inputs to a single-ended output of a receiver circuit further comprises driving the signals from the differential inputs to the single-ended output of the receiver circuit with a current mode logic circuit comprising first and second transistors that are coupled to the differential outputs of the driver circuit, wherein a drain of the first transistor is connected directly to a first resistor, wherein a drain of the second transistor is connected directly to a second resistor, wherein the first resistor is coupled to the second resistor, and wherein a source of the first transistor is connected directly to a source of the second transistor and to a current source.

13. The method defined in claim 10 wherein the second current mode logic circuit has differential inputs coupled to differential outputs of the first current mode logic circuit.

14. The method defined in claim 10 wherein a gate of the third transistor is coupled to the drain of the first transistor, and wherein a gate of the fourth transistor is coupled to the drain of the second transistor.

15. The method defined in claim 10 wherein the first current mode logic circuit further comprises a current source coupled to a source of the first transistor and to a source of the second transistor.

16. The method defined in claim 10 further comprising:
    transmitting a signal from the single-ended output of the receiver circuit through a plurality of configuration scan registers in the second power supply domain.

17. An integrated circuit comprising a differential interface, wherein the differential interface comprises:
    first means for converting a single-ended input signal into differential output signals, the first means for converting to receive a first power supply voltage and a first ground voltage in a first power supply domain in the integrated circuit; and second means for converting the differential output signals into a single-ended output signal, the second means for converting to receive a second power supply voltage and a second ground voltage in a second power supply domain in the integrated circuit, wherein the first and the second power supply domains are electrically isolated from each other in the integrated circuit, wherein the first means and the second means for converting are in the integrated circuit, wherein the second means for converting comprises a first current mode logic circuit that comprises a first transistor, a second transistor coupled to the first transistor, a first resistor coupled between a drain of the first transistor and a node at the second power supply voltage, wherein the second power supply voltage is above the second ground voltage, and a second resistor coupled between a drain of the second transistor and the node at the second power supply voltage.

18. The integrated circuit defined in claim 17 wherein the first means for converting comprises a splitter circuit.

19. The integrated circuit defined in claim 18 wherein the first means for converting further comprises a second current mode logic circuit coupled to the splitter circuit, wherein the second current mode logic circuit comprises third and fourth transistors and a current source, wherein the current source is coupled to a source of the third transistor and to a source of the fourth transistor.

* * * * *